United States Patent [19]

Stover et al.

[11] 3,914,708

[45] Oct. 21, 1975

[54] BI-STATE VARACTOR PHASE MODULATION NETWORK AND PROCESS FOR CONSTRUCTING SAME

[75] Inventors: Harry L. Stover, Newbury Park; Hayden M. Leedy, Thousand Oaks, both of Calif.

[73] Assignee: Hughes Aircraft Company, Culver City, Calif.

[22] Filed: Jan. 14, 1974

[21] Appl. No.: 432,923

Related U.S. Application Data

[63] Continuation of Ser. No. 305,049, Nov. 9, 1972, abandoned.

[52] U.S. Cl. ............ 332/30 V; 333/31 R; 333/31 A

[51] Int. Cl.$^2$. H03C 3/22; H03H 7/30; H03K 17/74

[58] Field of Search ............. 333/31 A, 31 R, 98 R; 332/16 R, 29 R, 30 R, 30 V; 307/320

[56] References Cited

UNITED STATES PATENTS

| | | | |
|---|---|---|---|
| 3,638,143 | 1/1972 | Higashi et al. | 332/30 V |
| 3,778,645 | 12/1973 | Mattauch et al. | 332/30 X |

*Primary Examiner*—James W. Lawrence
*Assistant Examiner*—Marvin Nussbaum
*Attorney, Agent, or Firm*—William J. Bethurum; W. H. MacAllister

[57] ABSTRACT

Disclosed is a bi-state varactor diode phase modulation network and process for fabricating the diode wherein conductivity type determining ions are implanted in an epitaxial layer of a semiconductor body to form a desired impurity profile and a varactor PN junction therein. During this ion implantation in which both N and P type ions are separately and independently accelerated into the semiconductor body, an N type impurity profile is initially established within the active epitaxial region and thereafter, a very shallow $P^+$ region is formed at the epitaxial layer surface. The N type impurity concentration increases going away from the PN junction over a first region of the epitaxial layer and at a controlled slope up to a point of a maximum impurity concentration. Thereafter, the N type impurity concentration decreases over an adjacent, second region of the epitaxial layer and also at a controlled slope to a point of minimum impurity concentration. When a suitable range of bias voltage is applied to the varactor to reverse bias its PN junction, the concentration of carriers in the above first and second regions of the epitaxial layer is such that the junction capacitance of the varactor may be switched at frequencies at least up to about 100 gigahertz (GHz) and on a relatively steep slope between two substantially constant values of junction capacitance. Alternatively, a Schottky barrier junction may be used instead of a PN junction.

9 Claims, 12 Drawing Figures

BI-STATE VARACTOR PHASE MODULATION NETWORK AND PROCESS FOR CONSTRUCTING SAME

Figure 1A:
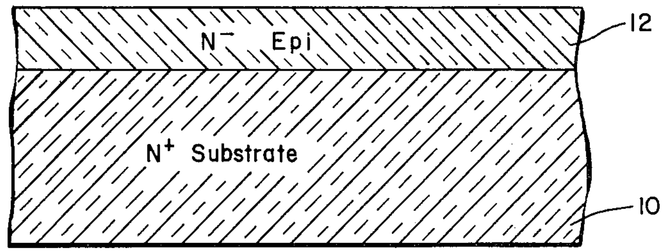

This is a continuation-in-part patent application of Ser. No. 305,049 filed on Nov. 9, 1972, and now abandoned.

FIELD OF THE INVENTION

This invention relates generally to varactor diodes and more particularly to a totally novel bi-state varactor diode phase modulation and phase-shifting network which exhibits a bistate capacitance versus-voltage characteristic at frequencies where such characteristic was heretofore unattainable in the prior art. It is to be understood that the term "phase modulation" as used herein refers to any kind of phase variation which the varactor diode introduces into the signal being controlled.

BACKGROUND

The varactor diode is a well-known semiconductor device which derives its name from the term "variable reactance diode." The capacitance of the PN junction of a varactor diode may be varied within limits by varying the reverse bias voltage applied thereto by a given amount. It is this characteristic of the varactor diode which makes it useful in a wide variety of millimeter wave and microwave applications, some of which will be discussed below.

In certain types of microwave circuit applications, it is desirable to rapidly change the impedance at selected circuit points from one to another of two substantially constant values. For example, one such very important and common circuit application is a bi-phase modulator which can use either a PIN diode or a varactor diode to provide these separate impedance states. When a PIN device is used as a microwave bi-state impedance device, it is operated either in its forward conduction state in which the PIN device approximates a short circuit, or in its reverse bias state in which the PIN device approximates an open circuit. The microwave reflection coefficient and phase difference between these two states is $\pi$ radians (180°); hence, the PIN device has applications as a $0-\pi$ phase shift keyed (PSK) pulse code modulation (PCM) bi-phase modulator.

A serious disadvantage of utilizing a PIN device in the above manner is that the modulator driver which switches the PIN device between separate impedance states must drive a low impedance load part of the time and a high impedance load part of the time. In addition, a significant power level is required to hold the forward conduction state of this device. At low modulation rates, it is relatively simple to find a PIN driver which can be used to supply the high forward current at very low impedances; but drivers for supplying sufficiently high currents to low impedances for high modulation rates do not exist. Furthermore, the restriction of the PIN device to either the zero or the very high impedance state introduces significant distortion into the output waveform, and such distortion is difficult to overcome. For these reasons, varactor modulators are generally preferred to PIN modulators for high data rates.

$0-\pi$ PSK or PCM modulators have been built using conventional varactor diodes, but these modulators also have certain disadvantages inherent in their operation. The conventional varactor diode may be switched from one value of capacitance, C1, to some other value of capacitance, C2, and when the associated RF circuitry of this modulator is properly designed, the varactor can be made to approximate a short circuit and an open circuit in one and the other of its two capacitance states, respectively. Hence, the reflection coefficient of the varactor diode is 180° out of phase between these two capacitance states just as with the PIN device. This conventional varactor approach has the advantage over the above PIN approach in that the modulator driver power requirements are substantially reduced. That is, the varactor driver sees a high impedance (no current conduction) in either capacitance condition C1 or C2. However, the disadvantage of the above conventional varactor approach of the prior art is that the conventional varactor has a continuous capacitance-voltage dependence and is not a natural bi-state device. As a result, any ripple or AM noise on the driver waveform is converted to phase noise in the RF signal which is reflected from the varactor circuit.

Efforts have been made to design bi-state MOS type switching networks wherein an MOS device could be switched from one to another of two substantially constant capacitance states. However, these MOS devices are frequency limited as a result of the charge storage characteristics of the oxide layer of the MOS device. Typically, these devices do not operate in a bistate C-V manner for frequencies beyond about 1 megahertz (MHz). Such devices include the so-called MOLL diode which is described by S. M. Sze in *Physics of Semiconductor Devices*, John Wiley, 1969, at page 425 et seq., and also the gate-controlled diode described on page 557 of Sze.

THE INVENTION

The general purpose of this invention is to provide a novel bi-state varactor phase modulation network which has most, if not all, of the advantages of similarly employed diode modulation networks and yet possesses none of the aforedescribed disadvantages associated with conventional PIN and varactor diodes. To attain this purpose, the varactor diode of the phase modulation network described herein is doped in such a manner as to exhibit an impurity profile whose concentration increases over a first region and at a controlled slope to a point of maximum impurity concentration. Thereafter, the concentration of impurities decreases over a second region and also at a controlled slope down to a level of minimum impurity concentration. In a preferred embodiment of the invention, this impurity profile is achieved by implanting ions in an epitaxial layer of the diode structure and simultaneously controlling the ion velocities and doses using known ion implantation processes. As a result of the above impurity profile, the varactor diode can be switched at frequencies in excess of 100 GHz along a steep slope of its capacitance-versus-voltage characteristic and between one and another of its two relatively constant capacitance states.

Accordingly, an object of this invention is to provide a novel bi-state varactor phase modulation network.

Another object is to provide a varactor diode network of the type described wherein the diode exhibits an impurity profile whose limits are precisely and controllably defined with respect to the boundaries of an epitaxial layer of the diode.

Another object is to provide a varactor diode phase modulation network of the type described having a large capacitance ratio change for a given bias voltage change. The varactor diode used herein is referred to as a "steep slope" varactor.

Another object is to provide a varactor diode network of the type described whose baseband driver requirements are reduced relative to those of prior varactor phase modulation networks. That is, the bias pulse waveform shape for driving the varactor is not critical, and the bias pulse amplitude is less than that required for conventional varactors.

Another object is to provide a varactor diode phase modulation network of the type described having a high RF power handling capability before the varactor's modulator begins to distort the output signal.

Another object is to provide a varactor diode phase modulation network which can be advantageously used in an improved bi-phase or bi-frequency modulator.

Another object is to provide a varactor diode phase modulation network of the type described having a low insertion loss to an RF signal.

Another object is to provide a varactor diode phase modulation network which, relative to conventional varactor phase modulation networks, operates with less signal distortion due both to bias ripple and to RF parametric pumping.

Another object is to provide a varactor diode network of the type described which, relative to prior varactor networks, operates with lower PN junction temperature and features a lower thermal resistance.

Another object is to provide a novel process for fabricating the present bi-state varactor diode, said process featuring improved processing and fabrication control due to the ion implantation techniques used. This process combines solid state epitaxial and ion implantation techniques in a novel process sequence which may be utilized in the rapid, high yield fabrication of bi-state varactor diodes.

DRAWINGS

Figure 1B:
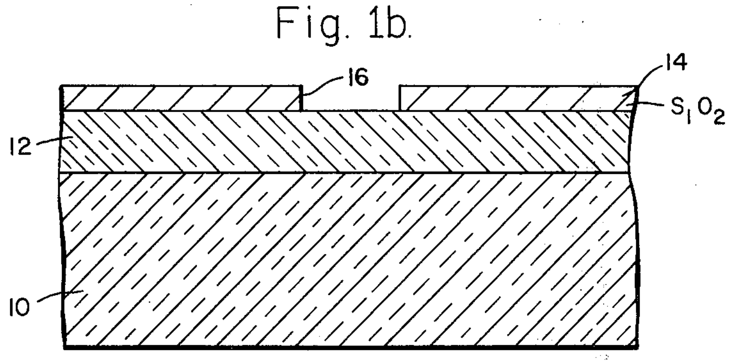
Figure 1C:
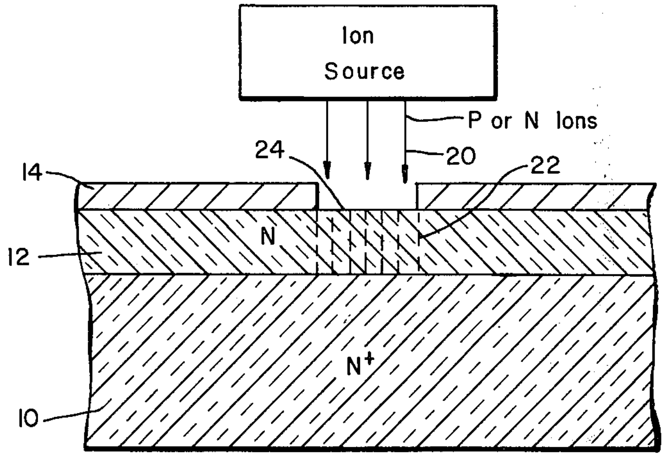

FIGS. 1*a*–1*c* illustrate, in diagrammatic cross-section and in process sequence, a portion of the process according to the present invention. This portion of the process is used in the fabrication of both of the embodiments of the invention described below.

Figure 2A:
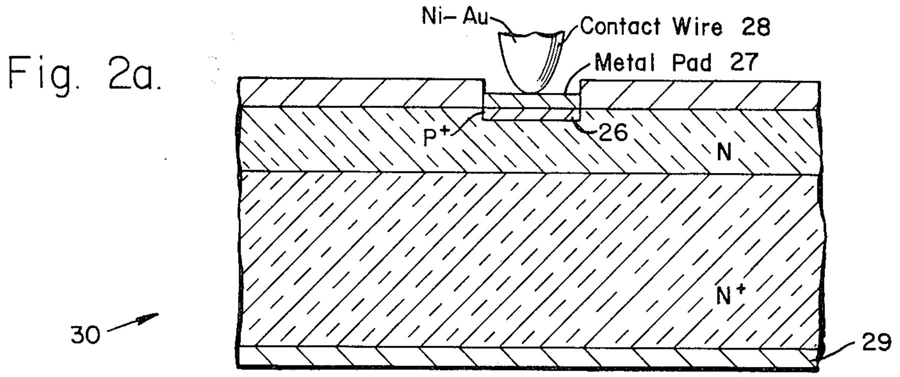

FIG. 2*a* illustrates, in diagrammatic cross-section, a preferred embodiment of the bi-state varactor PN junction diode structure according to the invention.

Figure 2B:
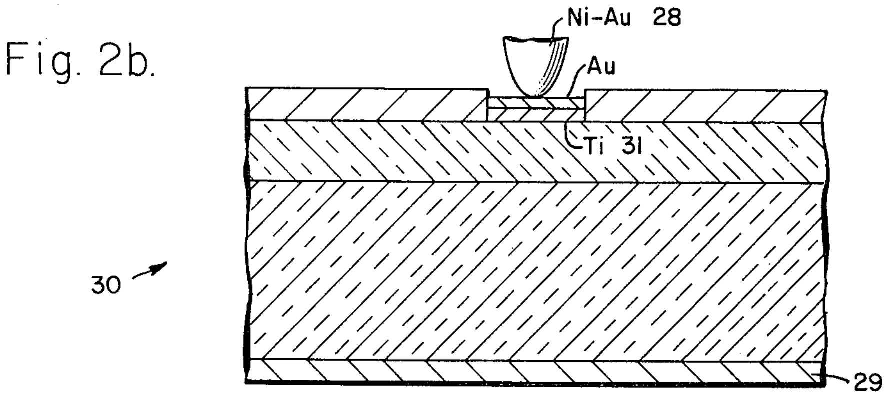

FIG. 2*b* is a Schottky barrier structure fabricated according to the process of FIG. 1.

Figure 3:
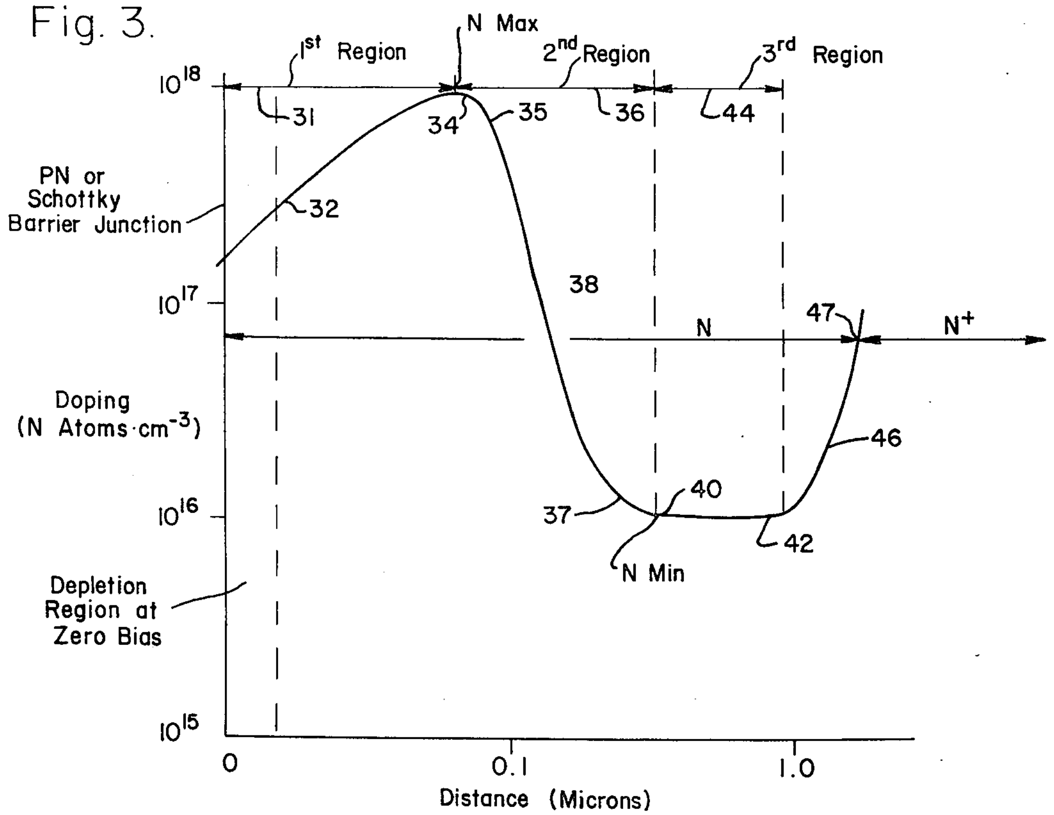

FIG. 3 is an impurity profile representative of the varactor diode structures of either FIG. 2*a* or 2*b*.

Figure 4A:
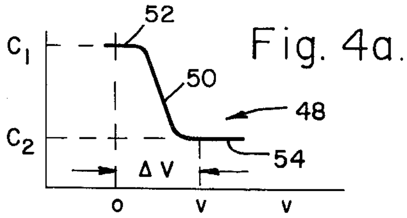
Figure 4B:
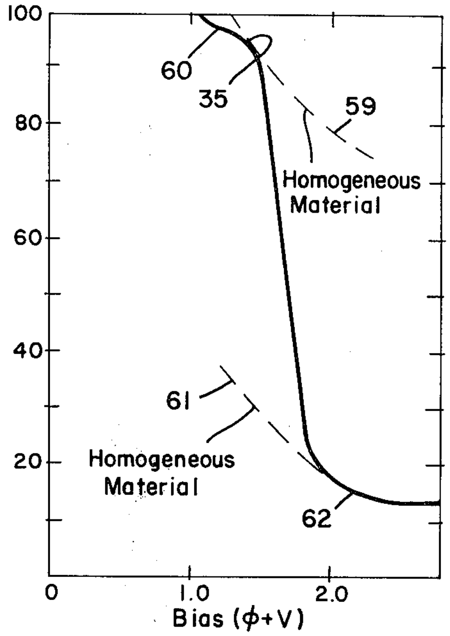

FIG. 4*a* and 4*b* illustrate, respectively, an ideal capacitance-versus-voltage (C-V) characteristic for a bi-state varactor and the actual measured C-V characteristic of a bi-state varactor fabricated according to the present invention.

Figure 5A:
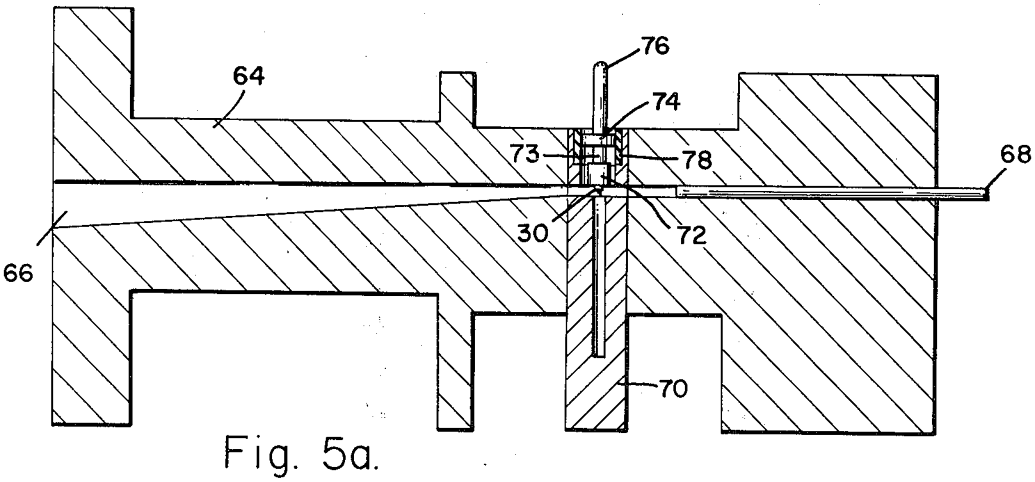
Figure 5B:
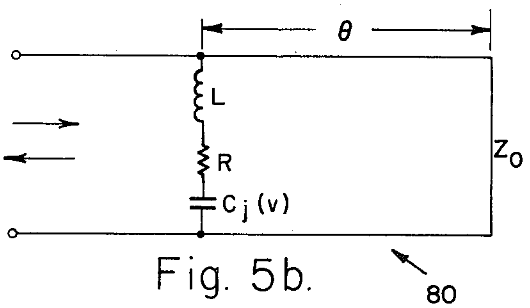
Figure 5C:
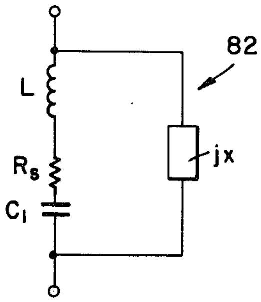

FIGS. 5*a*–5*c* illustrate, respectively, the varactor diode phase modulator according to the invention and the equivalent circuits for same.

Figure 6:
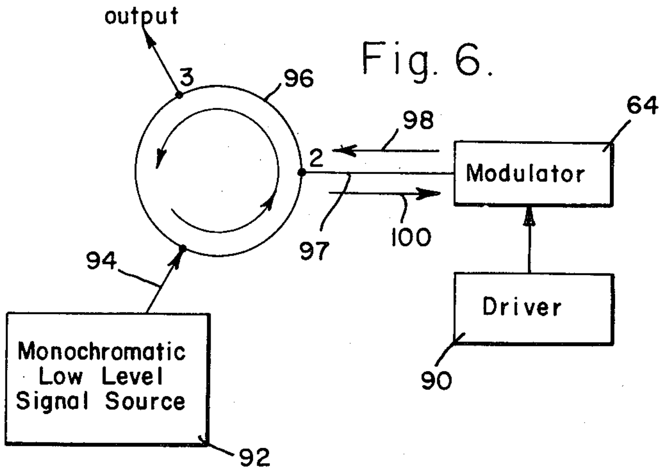

FIG. 6 is a block diagram of a complete phase modulation system utilizing the bi-state varactor diode described herein.

GENERAL PROCESS DESCRIPTION

Referring now to FIG. 1*a*, the varactor's substrate starting material 10 is low resistivity $N^+$ silicon of approximately 0.001 ohm·centimeters resistivity. This substrate is initially lapped and polished using conventional semiconductor processing techniques in preparation for an epitaxial deposition step in which an $N^-$ epitaxial layer 12 is formed. This epitaxial layer 12 may be conveniently formed using, for example, the well-known silane process in which $SiH_4$ is thermally decomposed at a chosen elevated temperature on the order of 1000°C to deposit epitaxial silicon on the upper surface of the substrate 10 as shown.

The structure of FIG. 1*a* is then further processed using conventional oxide growth and photolithographic masking and etching techniques in order to form a silicon dioxide, $SiO_2$, mask 14 thereon as shown in FIG. 1*b*. The $SiO_2$ layer 14 may be formed by introducing, in a known manner, a chosen amount of oxygen into a silane combustion chamber in order to deposit a pyrolytic $SiO_2$, and a photoresist pattern (not shown) is then formed atop the $SiO_2$ layer and developed using one of several known photolithographic processes for forming the opening 16 in the $SiO_2$ mask 14. A photoresist such as Kodak Metal Etch Resist (KMER) sold by the Eastman Kodak Company of Rochester, N.Y. is one of the well-known resist masks which may be used, in which case the exposure of selected areas of this mask to ultraviolet light will serve to develop same and thus provide the $SiO_2$ mask geometry shown for the layer 14. A buffered hydrofluoric acid (HF) solution is used to preferentially etch away the oxide which was in the region defined by the opening 16 in order to expose the selected surface area of the epitaxial layer 12 as shown.

The structure of FIG. 1*b* is then transferred to an ion beam accelerator and selectively positioned a suitable distance away from an ion source 18 from which both N and P-type ions may be separately and independently focused in a scanning beam 20 toward the opening 16 in the $SiO_2$ layer 14. Such ion implantation is illustrated in FIG. 1*c* and will serve to change the conductivity of the epitaxial layer 12 which is exposed by the opening 16. This implantation may also be used to form a varactor PN junction therein as will be described.

In the preferred embodiment of the invention, ion implantation is used to form a varactor PN junction, and a device fabricated by this process is illustrated in FIG. 2*a*. In this process, the initial N type ion implantation is followed by a P type implantation. In an alternative embodiment of the invention illustrated in FIG. 2*b*, a Schottky barrier junction is used instead of a PN junction, in which case the P type implantation step is omitted.

Referring back to FIG. 1*c*, in the fabrication of both the PN junction varactor and the Schottky varactor, initially N-type ions, such as arsenic or phosphorous ions, are accelerated at pre-established energies into the epitaxial layer 12 to convert the $N^-$ epitaxial layer in region 22 to a lower resistivity N-type material. This N-type ion implantation step involves one or more ion implants at presecribed energy levels and time durations in order to precisely tailor the impurity profile of the epitaxial layer to a desired shape. The details of this impurity profile are further described below with reference to FIG. 3, and also are set forth with particularity in the examples given below.

Now, in the fabrication of the PN junction varactor, $P^+$ ions, such as boron ions, are accelerated from source 18, through the opening 16 in the $SiO_2$ and into the epitaxial layer 12 to form the PN junction 26. Both of the above ion implantation steps are controlled in ion implantation energy and dosage to tailor the impurity profile to the varactor diode by any desired amount. It will become apparent below that the particular control we exert over this N and P ion implantation doping enables us to achieve a novel varactor diode impurity profile heretofore unknown in state-of-the-art epitaxial and diffusion techniques. After the $P^+$ ion implantation has been completed, the varactor diode structure of FIG. 1*c* is transferred to an anneal furnace where it is annealed at a predetermined time and temperature. (See Examples below.) Thereafter, the varactor structure is transferred to a suitable metallization system wherein metal ohmic contacts 27 and 29 are deposited on the opposing surfaces of the structure using conventional metal evaporation techniques. A suitable multi-layer metal system represented as pad 27, and including successive layers of titanium, tungsten and gold, is deposited as shown to make good ohmic contact with the $P^+$ region of the varactor. Next, an Au-$N_1$ whisker contact wire 28 is brought into electrical contact with the pad 27 for connecting the device to the outside world.

In the fabrication of the Schottky varactor of FIG. 2*b*, the $P^+$ ion implantation described above is omitted and instead, after the above anneal step, the Schottky junction is formed at the metal silicon interface as a result of the metal-silicon contact per se as is well-known. To establish a good Schottky junction at the metal-silicon interface, a titanium pad 31 is deposited on the silicon surface prior to the deposition of the gold pad 27 thereon; as shown in FIG. 2*b*.

Referring now to FIG. 3, the impurity profile shown here for both of the varactor diodes in FIGS. 2*a* and 2*b* includes a first region 31 wherein the concentration of the impurity profile increases at a controlled slope 32 up to a point 34 of maximum impurity concentration, which is on the order of $10^{18}$ atoms per cubic centimeter. From this point 34 of maximum impurity concentration, the concentration of the impurity profile decreases through a second region 36 of the epitaxial layer of the varactor structure and with a controlled slope 38 down to a point 40 of minimum impurity concentration. At point 40, the ion implantation doping approaches the $N^+$ background impurity concentration of the epitaxial layer 12 and is relatively constant over a portion 42 of a third region 44 of the varactor structure. The tail 46 of the impurity profile in the third region 34 is indicative of the low resistivity $N^+$ substrate 10 upon which the $N^-$ epitaxial layer 12 was formed, and point 47 on the impurity profile represents the N-$N^+$ boundary.

The true significance of the shape of the impurity profile shown in FIG. 3 will be better understood with reference to FIGS. 4*a* and 4*b* below. In this description, the capacitance-versus-voltage switching characteristic 56 of the varactor diode will be related to the impurity profile in FIG. 3. From this description, it will be seen that the distribution of charge carriers as defined by the impurity profile is directly related to the improved bistate switching operation of our varactor diodes. First, with reference to FIG. 4*a*, there is shown a capacitance-versus-voltage characteristic 48 of an ideal bi-state varactor, and this characteristic 48 includes a rather steep slope portion 50 which extends between a first high capacitance state 52 and a second low capacitance state 54. Ideally, if it were possible to fabricate a varactor diode with the C-V characteristic shown in FIG. 3*a*, then any AM noise appearing on the varactor's driver pulse and utilized in switching the varactor diode between the two capacitance states 52 and 54 would not be converted to FM noise at the varactor output. The varactor diodes of the present invention approach this ideal structure and C-V characteristic.

Referring now to FIG. 4*b*, there is shown the capacitance-versus voltage (C-V) characteristic of a varactor diode which we have actually reduced to practice. The capacitance is in picofarads (pf) and the bias voltage is expressed as $\phi + V$, where $\phi$ is the built-in diode potential and V is the bias applied externally to the varactor. This characteristic 56 includes a steep slope portion 58 which extends between an upper plateau capacitance region 62 having a relatively small slope and a lower plateau capacitance region 62, also having a relatively small slope when compared to the steep slope portion 58. This C-V curve was measured for the Schottky varactor diode shown in FIG. 2*b* and, as will be explained in the Examples below, this C-V characteristic is equally applicable to the PN junction varactor in FIG. 2*a*. This C-V characteristic is not the ideal C-V characteristic of FIG. 4*a*, but it more closely approaches this ideal C-V characteristic than that of any varactor diodes presently known to us. In FIG. 4*b*, the upper capacitance plateau 60 corresponds to a relatively low $\phi + V$ voltage on the order of 1 volt or greater, and the lower capacitance plateau 62 corresponds to a $\phi + V$ voltage on the order of 2.2 volts or greater. Each capacitance plateau 60 and 62 represents a capacitance state for the varactor which is relatively insensitive to minor voltage fluctuations on the driver (bias). These values of C appear as lumped capacitances to RF. It is important to note here that a nominal driver voltage between 0.75 volts and 2.25 volts is required to switch the varactor from one capacitance state to the other.

The dashed lines 59 and 61 in FIG. 4*b* indicate a corresponding portion of the C-V characteristic of a prior art varactor in which the epitaxial layer of the varactor was a homogeneous semiconductor material. The present varactors differ from the conventional prior art varactors made from homogeneous semiconductor materials in several respects, the main distinction being that the capacitance of a conventional varactor varies continuously with voltage and does not have the above capacitance plateau regions 60 and 62. Thus, the conventional varactor is very sensitive to AM noise fluctuations on the bias voltage, and these fluctuations are converted to FM or PM noise on the output RF signal.

Referring now to both FIGS. 3 and 4*b*, when the reverse bias voltage on the varactor is increased from zero toward one volt, this change has the effect of sweeping some of the mobile charge out of the first region 31 of the varactor structure. But this region 31 is a heavily doped region, increasing in impurity concentration from greater than $10^{17}$ atoms/cc. to a level approaching $10^{18}$ atoms/cc. at point 34. And because of the relatively large voltage increment required to sweep charge from this heavily doped region 34, there is very little varactor capacitance change with $\phi + V$ voltage changes less than about $\phi + V = 1.3$ volts. This portion of the C-V characteristic is represented as the plateau region 60 in FIG. 3*b*. As the varactor $\phi + V$ voltage is now further increased beyond 1.3 volts and toward 2.0 volts, there is a relatively large change in capacitance with voltage in this portion 58 of the C-V characteristic as a result of the sharply decreasing impurity concentration in region 36 (FIG. 3) of the varactor's epitaxial layer. So when operating in this portion of the C-V characteristic, there is a large capacitance swing for a relatively small change in $\phi + V$ voltage. Voltage changes in $\phi + V$ beyond about 2.2 volts and up to breakdown voltage have an insignificant effect on varactor junction capacitance.

The deflection point 35 on the impurity profile in FIG. 3 at the maximum ΔN/ΔW point corresponds to the deflection point 35' on the C-V characteristic of FIG. 4b at the maximum $$\frac{\Delta C}{\Delta \phi + V}.$$

The punch through voltage for the varactor, which is that voltage required to sweep all carriers out of the second and third regions 36 and 44 of FIG. 3, produces a so-called punch through condition at the $N - N^+$ boundary in FIG. 3. That is, when carriers are depleted from the second and third regions 36 and 44 of FIG. 3, then further changes in $\phi + V$ will produce no further capacitance changes in the varactor. For this reason, the $N - N^+$ boundary line 47 corresponds to $\phi + V$ punch through voltage and to the second capacitance plateau 62 in FIG. 4b where C is relatively constant.

The second and third regions of the impurity profile of FIG. 3 correspond to values actually measured for the Schottky diode of FIG. 2b and using an automatic profile plotter, which is also referred to as a "profiler" or "profilometer." At very shallow depths into the N epitaxial between 0 – 0.1 microns, the portion 32 of the impurity profile 31 is difficult to measure due to these very shallow dimensions, due to the resolution of the profiler, and in the case of the Schottky varactor, due to a leaky device under reverse bias conditions. However, the maximum point 34 on the profile has been measured by the profiler and the N epitaxial layer surface concentration can be closely approximated as the value shown, so that the slope 32 of the first region 31 of the profile is accurate to a very close approximation.

Referring now to FIG. 5a, there is shown a novel microwave circuit application, i.e. a varactor diode phase modulator in which the present varactor diode is advantageously used. The waveguide structure 64 in FIG. 5a is a binary $0 - \pi$ phase-shift keyed pulse-code modulator. The waveguide 64 includes a passage 66 along which microwaves are propagated from the varactor diode 30 mounted as shown in the waveguide cavity. The waveguide 64 includes a movable tuning short 68 which is mounted in one end of the waveguide, and the varactor diode 30 is included within the diode package 70 located in the center of the waveguide. The diode 30 is securely bonded to a silver pin 72 which is in turn integrally formed with intermediate post 73. The post 73 is joined to a small RF choke filter 74 and to a cylindrical output terminal post 76. The RF filter 74 is in the form of a small disk which extends radially as shown into contact with a dielectric seal 78. This RF choke construction also is well-known in the waveguide art and keeps RF out of the bias supply while minimizing RF losses in this portion of the waveguide. It also enables the diode 30 to be readily removed from within the diode package 70. Bias pulses from an external driver (not shown) are applied to the post 74 for biasing the varactor diode 30 along its C-V characteristic, as previously described.

FIG. 5b shows an equivalent circuit for the varactor diode 30, wherein L is the equivalent inductance of the varactor, $R_s$ is the series resistance of the varactor, and $C_j(V)$ is the junction capacitance of the varactor corresponding to an applied voltage V. $Z_0$ is the terminating impedance of the movable short 68 a phase distance $\theta$ from the diode 30. When the varactor 30 is biased so that its capacitive reactance is equal to its inductive reactance, i.e.

$$\omega L = \frac{1}{\omega C_1},$$

then the waveguide of FIG. 5a will be in its low impedance series resonant state, the equivalent circuit for same being shown in FIG. 5c. In this low impedance state of the varactor 30, substantially all of the incoming microwave energy entering the opening 66 is reflected, and the terminating reactance $jX$ is equal to $jZ_0 \tan \theta$, where $$X = \omega L = \frac{1}{\omega C_1}.$$

When the varactor capacitance is switched to another, different value designated C2, the modulator 64 is switched simultaneously to its high impedance parallel resonant state wherein substantially all of the microwave energy entering the waveguide 64 is reflected by the parallel resonant circuit consisting of the varactor diode 30 and the short 68 in parallel resonance. The equivalent circuit for the latter is also shown in FIG. 5c. However, in the latter state the reactance $jX$ for the equivalent circuit in FIG. 5c are given as follows:

$$jX = -j\frac{R_s^2 + \left(\omega L - \frac{1}{\omega C_2}\right)^2}{\left(\omega L - \frac{1}{\omega C_2}\right)}$$

Thus, the RF signals which are reflected from the waveguide cavity in the above resonant states will have $\pi$ radians phase difference, and this type of $0 - \pi$, PSK - PCM modulation is widely used in high data rate systems.

It will be understood that the short 68 will provide the terminating impedance with a value $Z_0$ for the waveguide structure shown in FIG. 5a. It will also be understood by those skilled in the art that the present invention is adaptable for use with both waveguides and two wire transmission lines. Thus, the terms "short" and "terminating impedance" and the terms "conductors" and "waveguide" may be used interchangeably herein. Furthermore, the input/output connections or "ports" for the waveguide and equivalent circuits shown in the drawing may also be used interchangeably herein. Thus, the novel phase modulation and switching concepts of the present invention are not limited to the particular wave propagation means to which our bistate varactor is connected.

Referring now to FIG. 6, there is shown a complete modulator system in which the waveguide circuit 64 can be used, and this system includes the modulator 64 which is driven by a bias pulse from the driver 90. The single frequency signal from the source 92 is coupled by a suitable transmission line 94 to a circulator 96. The signal in the circulator 96 is then coupled via transmission line 97 into the modulator 64, and the reflected signal 98 from the modulator 64 is shifted 0 or $\pi°$ in phase with respect to the incoming signal 100, depending upon the pulse state of the driver 90. The reflected modulated signal 98 is then transmitted via the transmission line 97 back to the circulator 96 and is coupled out of the output port 98 to the next amplifier stage or antenna. Thus, the particular capacitance state of the varactor diodes previously described and used in the modulator 64 can shift the phase of the reflected signal 98 without introducing distortion into the signal or unnecessarily loading the driver 90.

SPECIFIC EXAMPLES OF VARACTOR FABRICATION

The following two examples list the pertinent data which will assist those skilled in the art in the rapid fabrication of the two varactor diodes embodying the invention. Because the Schottky junction is a leaky junction under reverse bias, the PN junction varactor of Example I below is the preferrred device. However, the Schottky varactor of Example II is given here to indicate that the invention is not specifically limited to a PN junction varactor.

EXAMPLE I

An $N^+$ silicon substrate of approximately 0.001 ohm·cm. is lapped and polished on one side and transferred to a suitable epitaxial reactor where a 1.1 micron N type silicon epitaxial layer of $10^{16}$ atoms·cm$^{-3}$ impurity concentration is deposited on the substrate. This epitaxial layer may be advantageously formed by the thermal decomposition of silane, $SiH_4$, at approximately 1000°C. Next, the above epitaxial structure is covered with a suitable $SiO_2$ mask as indicated above and transferred to an ion implantation chamber wherein arsenic ions are accelerated with an energy of 300 KeV or greater to provide a dosage of N type ions in the epitaxial layer on the order of $10^{14}$·cm$^{-2}$. Next, boron ions are implanted in the epitaxial layer at an energy of approximately 5 KeV and at a dosage of approximately 5 × $10^{14}$·cm$^{-2}$. Then the above ion implanted structure is transferred to an anneal furnace where it is annealed at 950°C for 15 minutes. The structure is then removed from the anneal furnace and transferred to a metal evaporation system wherein ohmic contacts are made respectively to the P ion implanted region and to the back side of the substrate region of the device.

EXAMPLE II

An $N^+$ silicon substrate of approximately 0.001 ohm·cm. was lapped and polished on one side and inserted into an epitaxial reactor wherein an N type silicon epitaxial layer of approximately 1 micron in thickness and $10^{16}$ atoms·cm$^{-3}$ in impurity concentration was grown by the thermal decomposition of silane, $SiH_4$. Next, the above epitaxial structure was covered with an $SiO_2$ mask as indicated above and than transferred to an ion implantation chamber wherein arsenic ions were accelerated into the epitaxial layer at an energy of 100 KeV. In this step, an implanted region with an N type ion dosage of 5 × $10^{14}$·cm$^{-2}$ was formed. The above ion implanted structure was then transferred to an anneal furnace and heated at 950°C for 15 minutes. Thereafter, the structure was transferred to a titanium-gold (Ti-Au) metallization system wherein initially, 1000 angstroms of Ti were deposited to form a first contact pad on the exposed epitaxial layer. Thereafter 3000 angstroms of Au were deposited on top of the Ti pad. These metals were successively deposited through a photoresist pattern formed atop the $SiO_2$ layer, with a 6 mil opening therein to control the geometry of these pads. Using the same metallization system, contact metallization was formed on the exposed backside area of the Si substrate. The photoresist was then removed using a suitable reagent, carrying therewith any excess overlying metallization and leaving intact the contact pads formed in the 6 mil opening. Then the Schottky varactor structure was connected to an automatic profile plotter which measured the impurity concentration in the epitaxial layer. As indicated in FIG. 3 above, this concentration was found to vary from a minimum value slightly greater than $10^{16}$ atoms·cm$^{-3}$, toward a maximum value approaching $10^{18}$ atoms·cm$^{-3}$, and with the slope indicated in FIG. 3 above. The automatic profiler discontinued its measurement after beginning a downward trace from near the $10^{18}$ atoms·cm$^{-3}$ point on the profile and toward a value of reduced impurity concentration near the varactor depletion region. The varactor device was then connected to a capacitance-voltage tracer wherein the C-V characteristic shown in FIG. **4*b*** was obtained. During this C-V measurement, $\phi$ was theoretically estimated to be 0.55 for the Schottky barrier junction.

It should be emphasized here that the precise shape of the impurity profile in FIG. 3 and the specific location of the data points from which this profile was derived are not critical to the bi-state operation of the varactor diode. The general contour of this impurity profile is of course an important feature of this invention because of the above-described relation between varactor capacitance and the number of carriers present in the epitaxial layer of the varactor. The number of carriers which are swept out of a portion of the epitaxial layer by a given change in bias voltage is of course directly related to the above-described impurity profile in the epitaxial layer. However, it will be appreciated by those skilled in the art of ion implantation that this doping process is extremely well suited for varying and tailoring the specific shape and slope of the impurity profile in FIG. 3 by any desired amount.

The implanted ions do not simply penetrate into the epitaxial layer and then stop; they stop after many collisions with the semiconductor lattice, and hence are scattered in a Gaussian statistical distribution about some mean depth into the epitaxial layer. The peak of this distribution occurs at some mean depth of implant which is known in the art as the projected range, $R_p$. This parameter, and the Gaussian standard deviation $\rho$ are important parameters for device design; and $\rho$ denotes the width of the Gaussian distribution at its half power point. Both $R_p$ and $\rho$ are functions of implant energy (kinetic energy of the ions), and the higher the energy, the deeper the implant, and the greater the standard deviation, $\rho$.

The other implant parameter of significance in determining the specific contour of the impurity profile in FIG. 3 is the dose, D, which is the number of particles per square centimeter of target area. The dose, D, is dependent upon the product of the ion-beam current and the time that the beam is impinging on the target. Thus, the peak doping level, $N_{max}$, of the Gaussian statistical distribution is related to the dose, D, and $\rho$ by a simple volume integration which yields:

$$N_{max} = \frac{\text{Dose}}{\sqrt{2\pi\sigma}}$$

Once $N_{max}$ is known, the doping $N_x$ at any distance $x$ into the epitaxial layer can be determined since it follows the Gaussian distribution expressed as:

$$N_x = N_{max}\, e^{\frac{(R_p - x)^2}{2\sigma}}$$

Thus, when a number of separate implants are made in the epitaxial layer and when these implants have spaced Gaussian distributions, the total doping profile in the epitaxial layer can be determined simply by algebraically adding these individual statistical distribution curves. By properly selecting the implant energy, E, and implant dose, D, for a given ion species (different masses and charge have different $R_p$ and $\rho$ for a given value of E), the desired doping distribution for a bi-state varactor can be obtained, either using a single implant or using multiple implants. For a further discussion of the subject of ion implantation generally, reference may be made to the textbook by James W. Mayer et al., ION IMPLANTATION IN SEMICONDUCTORS, Academic Press, 1970.

Finally, it should be emphasized that while the above-described process combination of epitaxy and ion implantation for fabricating a bi-state varactor is believed to be totally novel, the novel varactor diode structure described above can indeed be made by other known semiconductor processes. For example, a bi-state varactor according to the invention can be fabricated using multi-epitaxial techniques. It is possible to fabricate the above-described bi-state varactor by starting with an $N^+$ substrate as described and then epitaxially growing an $N^-$ layer thereon of approximately 0.9 microns in thickness and of $10^{16}$ atoms·cm$^{-3}$ in impurity concentration. Thereafter, an N epitaxial layer of approximately 0.1 microns in thickness and $5 \times 10^{17}$ atoms·cm$^{-3}$ in impurity concentration should be grown on the first epitaxial layer, followed by the growth of an $N^-$ epitaxial layer of approximately 0.1 microns in thickness and $10^{16}$ atoms·cm$^{-3}$ in impurity concentration on the N layer. Finally, a $P^+$ layer should be epitaxially deposited on the last $N^-$ layer, and this $P^+$ layer should be approximately 0.1 microns in thickness and on the order of $10^{20}$ atoms·cm$^{-3}$ in doping concentration. Thus, in the above proposed structure, the impurity profile will progress from the substrate, through a level of minimum impurity concentration and then sharply upward through the N layer to a level of maximum impurity concentration. From here the impurity profile will sharply decrease to a lower level of impurity concentration in the vicinity of the depletion region of the device. Conventional planar or mesa photolithographic and metallization processes can be used by those skilled in the art to complete the device.

Another proposed technique for fabricating our novel bi-state varactor structure is to start with the same $N^+$ substrate material and then grow an $N^-$ epitaxial layer thereon of approximately 1.1 microns in thickness and $10^{16}$ atoms·cm$^{-3}$ in doping concentration. Next, an N type region should be diffused into the epitaxial layer to a depth of approximately 0.2 microns, and this diffusion is made to compensate some of the $N^-$ type epitaxial material and to obtain the necessary N type region corresponding to the upper capacitance plateau of the capacitance-voltage characteristic of the device. Next, a heavy $P^+$ diffusion should be made into the above N type diffusion in order to form the PN junction for the varactor, and the above structure can then be metallized using conventional planar or mesa geometry fabrication processes. This proposed device will also have an impurity profile whose general contour is similar to that shown in FIG. 3 above. By making certain judicious process adjustments in the above epitaxial and diffusion processes, a desired bi-state C-V characteristic, such as the one illustrated in FIG. 4*b* above, may be obtained.

What is claimed is:

1. A low distortion high frequency phase modulation network for introducing a phase change into microwave or millimeter wave signals and having a bistate frequency switching capability at least in excess of approximately 100 gigahertz comprising:

a. conductive means including input and output ports for receiving said signals and for propagating reflected signals, b. a terminating impedance or short connected across said input and output ports, c. a bistate varactor diode connected in parallel with said terminating impedance or short and spaced therefrom an adjustable phase difference $\theta$, and d. means for biasing said varactor diode at one or another of its two relatively stable capacitance states; whereby said varactor diode will either approximate a series resonant condition or an antiresonant condition and thereby cause a predetermined phase delay in signals reflected on said conductive means in accordance with the resonant state of said varactor diode, whereby said varactor diode may be rapidly switched between said capacitance states at frequencies up to and including 100 gigahertz or higher.

2. The phase modulator defined in claim 1 wherein said bistate varactor diode includes an equivalent series connection comprising an equivalent inductance L, and an equivalent series resistance $R_s$, and a voltage dependent equivalent junction capacitance $C_j$, all connected in parallel with said terminating impedance or short whereby the terminating reactance $jX$ is equal to $jZ_0 \tan\theta$, where $$X = \frac{1}{\omega C_1},$$

and $Z_o$ is the value of of the terminating impedance or short, $C_1$ is equal to one substantially constant capacitance value of said varactor diode, and $jX$ is equal to $$jX = -j \frac{R_s^2 + (\omega L - \frac{1}{\omega C_2})^2}{(\omega L - \frac{1}{\omega C_2})}$$

where $C_2$ is another value of substantially constant capacitance for said varactor diode.

3. The phase modulator defined in claim 1 wherein said varactor diode includes:

a. a semiconductor structure including a layer of one conductivity type semiconductive material having a rectifying junction adjacent one edge thereof; and b. said layer characterized by an impurity profile which varies in impurity concentration at predetermined and controlled levels and depths beneath said rectifying junction and at controlled slopes between said predetermined impurity concentration levels so that when increasing levels of reverse bias are applied to said rectifying junction, the mobility of charge carriers in said layer causes the capacitance thereacross to change from one relatively stable value of capacitance to another.

4. The diode defined in claim 3 wherein the impurity concentration varies in a first region from approximately $10^{17}$ atoms per cubic centimeter toward a maximum level of approximately $8 \times 10^{17}$ atoms per cubic centimeter, and the impurity concentration varies across a second region from said maximum level to a minimum level of impurity concentration between $10^{15}$ and $10^{16}$ atoms per cubic centimeter.

5. The diode defined in claim 4 wherein said layer includes therein an opposite conductivity type region which forms a PN junction with said first region.

6. The diode defined in claim 4 wherein a Schottky barrier junction is formed at the surface of said first region.

7. The diode defined in claim 5 wherein said second region is implanted with N-type ions selected from the group consisting of arsenic and phosphorous ions to tailor the doping profile therein, and said opposite conductivity type region is formed by implanted P-type boron ions of a concentration on the order of $10^{21}$ atoms per cubic centimeter to form a heavily doped P-type region.

8. The diode defined in claim 6 wherein the impurity concentration varies in said first region from approximately $10^{17}$ atoms per cubic centimeter toward a maximum level of approximately $8 \times 10^{17}$ atoms per cubic centimeter, and the impurity concentration varies across said second region from said maximum level to a minimum level of impurity concentration between $10^{15}$ and $10^{16}$ atoms per cubic centimeter.

9. A low distortion high frequency phase modulation network for introducing a phase change into microwave or millimeter wave signals including:

a. conductive means including a pair of ports for receiving signals and for propagating reflected signals, b. a terminating impedance connected across said ports, c. a bistate varactor diode connected in parallel with said terminating impedance and spaced therefrom an adjustable phase difference $\theta$, said bistate varactor diode having two relatively constant capacitance plateaus in its capacitance voltage characteristic corresponding respectively to separate ranges of bias voltage for which said varactor diode draws no or negligible current, said varactor diode operative for switching between said plateaus at frequencies up to and including 100 GHz, and d. means for biasing said varactor diode at one or another of its two relatively constant capacitance plateaus, whereby said varactor diode will either approximate a series resonant condition or an antiresonant condition and thereby cause a predetermined phase delay in signals reflected to said ports in accordance with the resonant state of said varactor diode.

* * * * *